(12) United States Patent
Berthold et al.

(10) Patent No.: US 7,096,443 B2
(45) Date of Patent: Aug. 22, 2006

(54) METHOD FOR DETERMINING THE CRITICAL PATH OF AN INTEGRATED CIRCUIT

(75) Inventors: Jörg Berthold, München (DE); Henning Lorch, München (DE); Martin Eisele, München (DE)

(73) Assignee: Infineon Technologies AG, Munich (DE)

( * ) Notice: Subject to any disclaimer, the term of this patent is extended or adjusted under 35 U.S.C. 154(b) by 289 days.

(21) Appl. No.: 10/620,093

(22) Filed: Jul. 15, 2003

(65) Prior Publication Data

US 2004/0019450 A1    Jan. 29, 2004

Related U.S. Application Data

(63) Continuation of application No. PCT/DE01/04957, filed on Dec. 28, 2001.

(30) Foreign Application Priority Data

Jan. 15, 2001    (DE) ................................ 101 01 540

(51) Int. Cl.
*G06F 17/50* (2006.01)
*G06F 19/00* (2006.01)
*G06F 11/26* (2006.01)
*G01R 31/317* (2006.01)
*G01R 23/175* (2006.01)

(52) U.S. Cl. .............. 716/6; 716/13; 716/14; 703/16; 703/19; 702/179; 702/125; 702/181; 702/118; 702/189; 714/33; 714/700; 714/741; 324/532; 324/535; 324/617; 324/76.54; 324/76.74

(58) Field of Classification Search .................. 716/6, 716/13, 14; 703/16, 19; 702/79, 125, 181, 702/118, 189; 714/33, 700, 741; 324/532, 324/535, 617, 76.54, 76.74
See application file for complete search history.

(56) References Cited

U.S. PATENT DOCUMENTS 4,888,808 A * 12/1989 Ishikawa et al. ............ 381/103

(Continued)

FOREIGN PATENT DOCUMENTS

DE    199 00 974 A1    9/1999
EP    0 259 705 B1    3/1988

(Continued)

OTHER PUBLICATIONS

International Preliminary Examination Report for PCT/DE01/04957, pp. 1-7, English translation, filed Nov. 24, 2003.

(Continued)

*Primary Examiner*—Phallaka Kik
(74) *Attorney, Agent, or Firm*—Laurence A. Greenberg; Werner H. Stemer; Ralph E. Locher

(57) ABSTRACT

A method of determining the critical path of a circuit includes first determining the paths, their mean path transit times and their path transit time fluctuations. Paths having similar statistical parameters are combined to form one path group. For each path group, a statistical group figure is, then, calculated and, for the totality of paths considered, a statistical total figure is calculated. Finally, the critical paths of the circuit are determined by taking into consideration the total figure, comparing the group figures at or above a critical path transit time Tc.

13 Claims, 4 Drawing Sheets

U.S. PATENT DOCUMENTS 5,173,618 A * 12/1992 Eisenstadt .................. 327/239
5,389,831 A * 2/1995 Eisenstadt .................. 327/161
6,205,571 B1 * 3/2001 Camporese et al. ........... 716/2
6,311,313 B1 * 10/2001 Camporese et al. ........... 716/6

FOREIGN PATENT DOCUMENTS

| | | | |
|---|---|---|---|
| JP | 2000341239 A | * | 12/2000 |
| WO | 93/18468 | | 9/1993 |

OTHER PUBLICATIONS

Bowman, K. A. et al.: "Impact of Extrinsic and Intrinsic Parameter Fluctuations on CMOS Circuit Performance", IEEE Journal of Solid-State Circuits, vol. 35, No. 8, Aug. 2000, pp. 1186-1193.

Eisele, M. et al.: "The Impact of Intra-Die Device Parameter Variations on Path Delays and on the Design for Yield of Low Voltage Digital Circuits", IEEE Transactions on Very Large Scale Integration (VLSI) Systems, vol. 5, No. 4, Dec. 1997, pp. 360-368.

* cited by examiner

METHOD FOR DETERMINING THE CRITICAL PATH OF AN INTEGRATED CIRCUIT

CROSS-REFERENCE TO RELATED APPLICATION

This application is a continuation of copending International Application No. PCT/DE01/04957, filed Dec. 28, 2001, which designated the United States and was not published in English.

BACKGROUND OF THE INVENTION

Field of the Invention

The invention relates to a method for determining one or more critical paths of an integrated circuit.

Critical (signal) paths are those paths of an integrated circuit that limit the signal processing speed of the circuit and, thus, its efficiency. If the efficiency of the circuit is to be increased, the critical path must, first, be determined and, then, accelerated by optimization. The latter can be done by shortening the signal transit time of this path by stronger resistors or gates.

It is usually assumed that, in an integrated circuit, the critical path is determined by the "longest" path (i.e., the path with the maximum signal transit time Tm). It is, therefore, one aim of circuit development to find this longest path in the circuit.

The conventional procedure for finding the critical or longest path of a circuit lies in that, during an analysis or simulation of the circuit by the circuit design, it is established for each path whether or not it is longer than the longest one of the paths examined until that point in time. If it is shorter, it will no longer be taken into consideration thereinafter. If it is longer, it is considered to be the critical path until, possibly, an even longer path is determined.

It is also already known to determine a number of critical paths for an integrated circuit. For example, all paths analyzed, the signal transit time of which falls into the interval with the limits of 0.95×Tm to Tm, can be defined as critical paths (which, therefore, are to be optimized).

The present invention is based on the finding that such a method can no longer be applied with modern CMOS technologies. This is due to the fact that, in modern CMOS technologies, the uncorrelated statistical fluctuation of the transistor turn-on voltage increases, where the standard deviation of the distribution of the turn-on voltage can, in the meantime, be up to 40 mV. The gate and path transit times fluctuate correspondingly, the latter additionally depending on the number of gates on the path considered. These aspects are not taken into consideration in the known method for determining the critical path.

The effect described (influence of the fluctuation of the turn-on voltage on the criticality of the paths) is magnified further due to the lowering of the supply voltage currently practiced in the art. With 0.12 μm technology, the supply voltage is, now, only approximately 1.2 volts.

SUMMARY OF THE INVENTION

It is accordingly an object of the invention to provide a method for determining the critical path of an integrated circuit that overcomes the hereinafore-mentioned disadvantages of the heretofore-known devices and methods of this general type and that makes possible use of the method for circuits with low supply voltages.

With the foregoing and other objects in view, there is provided, in accordance with the invention, a method for determining at least one critical path of an integrated circuit limiting a processing speed of the integrated circuit, including the steps of, first, determining the paths provided in the integrated circuit, their mean path transit times, and their path transit time fluctuations are, first, determined.

The paths are, then, ordered in accordance with statistical aspects, i.e., paths that substantially have the same mean path transit times and the same path transit time fluctuations are combined to form one path group. For each path group, a group figure is, then, calculated that statistically describes the path transit time distribution of this path group. The statistical description takes into consideration that, as a rule, a path is of a number of gates, and the fact that, in most cases, a path group contains a number of paths (with substantially identical statistical characteristics). In addition, a figure that is called the total figure and that statistically describes the transit time distribution of the totality of the paths considered is calculated for the totality of the paths considered. Finally, the critical path or paths of the circuit are determined by comparing the group figures at or above a critical path transit time Tc. The critical path transit time Tc is determined by taking into consideration the total figure.

In the present text, the term "integrated circuit" can designate both an integrated circuit in its totality (chip) and a partial section of an integrated circuit.

Thus, an important aspect of the invention lies in statistically describing both the path transit times occurring in a path group and the path transit times occurring in the entire circuit considered. Thus, path transit time fluctuations in the path groups and in the entire circuit considered are, statistically, covered. Rating a path or, respectively, the paths of a group with respect to their "length" is, then, performed by taking into consideration all paths—unlike in the conventional methods. This is expressed by determining the critical path transit time Tc by taking into consideration the total figure.

For determining the critical path or paths, a value is, preferably, predetermined for the total figure and the critical path transit time Tc is determined as the path transit time at which the total figure assumes the predetermined value. Because the total figure is a statistical description of the path transit times occurring in the circuit, the predetermined value can be interpreted as a confidence value.

In accordance with another mode of the invention, the fact that (only) those paths, the group figures of which exceed a predeterminable threshold value at or above the critical path transit time, are determined as critical paths. The result is that of the potentially critical paths (those paths that have a non-disappearing group figure at or above the critical path transit time), only those having a higher statistical weight are actually considered as critical paths.

In accordance with a further mode of the invention, after the initial determination of the paths provided in the integrated circuit and their mean path transit times, a preselection of the paths still to be considered in the further course of the method is performed in such a manner that the paths, the mean path transit times of which are less than α×Tm, are immediately discarded, where Tm is the maximum mean path transit time determined in the preceding step and α is a quantity of less than 1 and, in particular, can be about 0.8. As a result, the computing effort required for the subsequent method steps can be clearly reduced.

An advantageous definition of the group figure is characterized by the fact that it is given by the integral over the sum of the probability distributions of the path transit times of the paths of the path group considered. In such a case, the product of the number of paths of the path group and of the probability distribution of a path of this path group can be formed for calculating the sum of the probability distributions (the path transit times of the paths of the group considered). In this approximation, the probability distributions of all paths of the path group are assumed to be identical. This reduces the computing expenditure for calculating the group figure.

The total group can be given, for example, by the sum of the group figures.

It is pointed out that the group figure and the total figure can also be statistical functions that are defined in another way. The only important factor for the invention is that the critical paths are determined by a statistical evaluation of the path transit times of all relevant paths of the circuit.

Other features that are considered as characteristic for the invention are set forth in the appended claims.

Although the invention is illustrated and described herein as embodied in a method for determining the critical path of an integrated circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
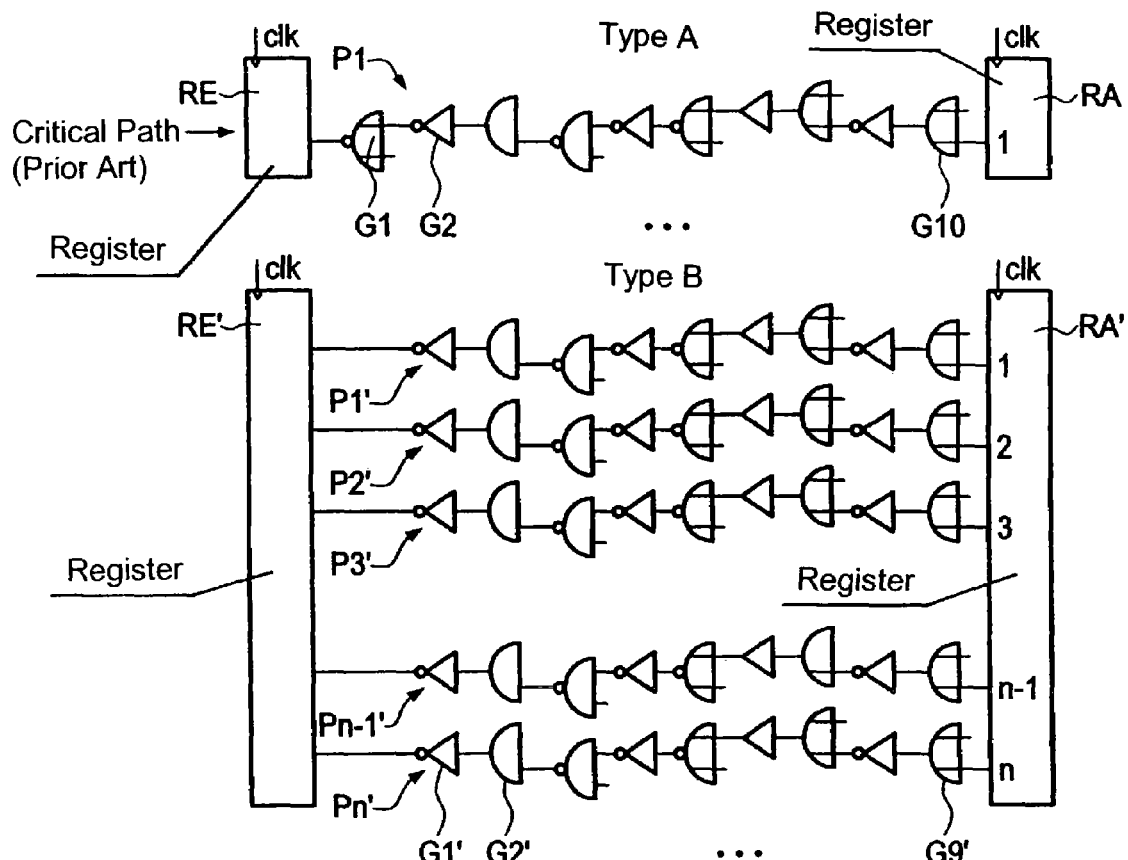
FIG. 1 is a schematic and block circuit diagram of various paths in a circuit.

Referring now to the figures of the drawings in detail and first, particularly to FIG. 1 thereof, there is shown, by way of an example, a circuit (for example, a circuit section) that includes a path P1 having ten serially disposed gates G1, G2, ..., G10 (type A) and n identical paths P1', P2', ..., Pn' being, in each case, nine serially disposed gates G1', G2', ..., G9' (type B). Paths P1 and P1', ..., Pn', respectively, in each case connect clocked input and output registers RE, RA and RE' and RA', respectively. The individual path P1 can be, for example, a path in a control unit, whereas the n identical paths P1'; P2', ..., Pn' typically form a processing unit such as, for example, an adder or a multiplier. For example, a 32×32 multiplier in a 31-stage pipeline exhibits 1024 paths with a length of eight gates each.

During the conventional time analysis of such a circuit for determining the critical path, it is found that path P1 is the longest path because its signal transit time is longer by one gate transit time than the signal transit times of all other paths P1', P2', ..., Pn'. Accordingly, path P1 would be identified as the critical path in the prior art. If the performance of the circuit is to be increased, path P1 would have to be accelerated by optimization.

Figure 2:
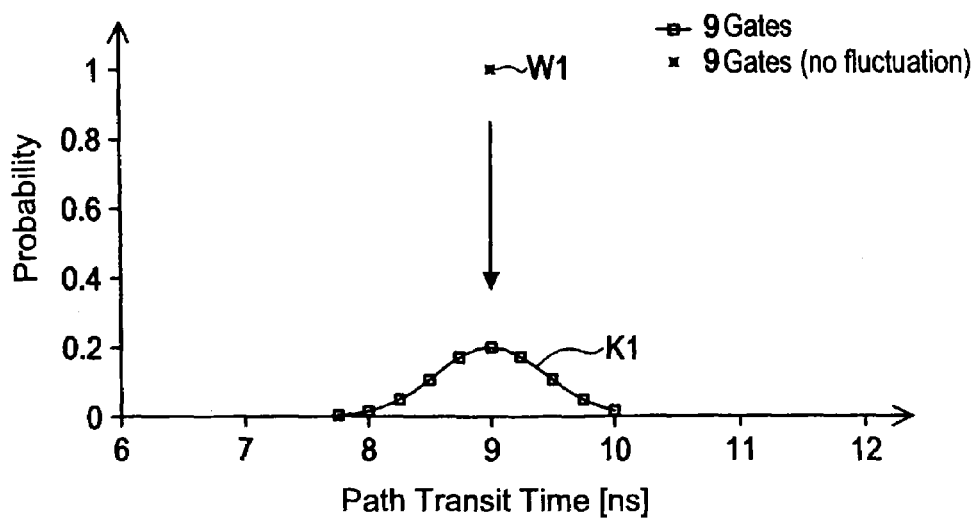
FIG. 2 is a graph illustrating a probability distribution of the path transit times of a path having nine gates.

In the diagram shown in FIG. 2, the probability distribution of the path transit times of one of the identical paths P1', P2', ..., Pn' of type B having nine gates is shown plotted against the path transit time specified in units of ns. The probability distribution (curve K1) exhibits a certain width caused by fluctuations in the gate transit time. If, by comparison, there were to be no fluctuation in the gate transit times, the probability distribution would be given by the sharp value W1=1 (i.e., 100% probability) at a path transit time of 9 ns.

The probability distribution shown by curve K1 is a normal distribution that is described by its mean value and its standard deviation. In the example shown here, the mean value is 9 ns and the standard deviation is 5% of the mean value.

The mean value and the standard deviation of the probability distribution K1 can be calculated in familiar manner from the mean values and standard deviations of the individual gate transit times that contribute to the path transit time. The mean value of the probability distribution of the path transit time is the sum of the mean values of the probability distributions of the gate transit times and the standard deviation of the probability distribution of the path transit time is the root of the sum of the squared standard deviations of the distributions of the gate transit time with respect to the individual gates. Assuming an identical probability distribution for the gate transit time for all gates of a path, the following is obtained:

$$\mu_P = N \cdot \mu_G$$

$$\sigma_P = \sqrt{N} \cdot \sigma_G$$

where:
- $\mu_P$ is the mean value of the path transit time distribution;
- $\mu_G$ is the mean value of the gate transit time distribution;
- $\sigma_P$ the standard deviation (spread) of the path transit time distribution;
- $\sigma_G$ is the standard deviation of the gate transit time distribution; and
- N designates the number of gates (with identical probability distribution) of the path considered.

It is pointed out that the individual gate transit time distributions are uncorrelated. The cause of the occurrence of the fluctuations lies in the finite number of ions implanted during the doping. Fluctuations that are attributable to systematic effects (e.g., changes in the manufacturing conditions) and, therefore, correlated are not considered in this analysis.

The statistical quantities $\mu_P$ and $\mu_G$, respectively, correspond to the nominal path transit time and the nominal gate transit time, respectively, i.e., the transit times that would occur with a turn-on voltage predetermined in a defined manner and equal in all transistors.

In the example shown in FIG. 2, the standard deviation of the gate transit time is 15% of the mean value $\mu_G$ of the gate transit time.

The probability distribution shown in FIG. 2 can be reshaped into a yield curve by integration. The yield curve corresponds to the probability function of the normal distribution. The abscissa, now, no longer specifies the path transit time but represents the period of the clock signal clk with which the registers RE' and RA' shown in FIG. 1 are clocked. If the clock period is about 9 ns, the yield is only about 50% due to the path transit time fluctuation. It is only with longer clock periods of approx. 9.4 ns that the yield is about 90%. That is to say, if the input register RE' changes from the logical state 0 to the logical state 1 at its output at a reference time t=0 and the output register RA' reads out the logical state at the output of path P1' at time t=9.4 ns, the probability that these state changes at the input of the path P1' has become noticeable at the output, in the meantime, is 90%.

Figure 3:
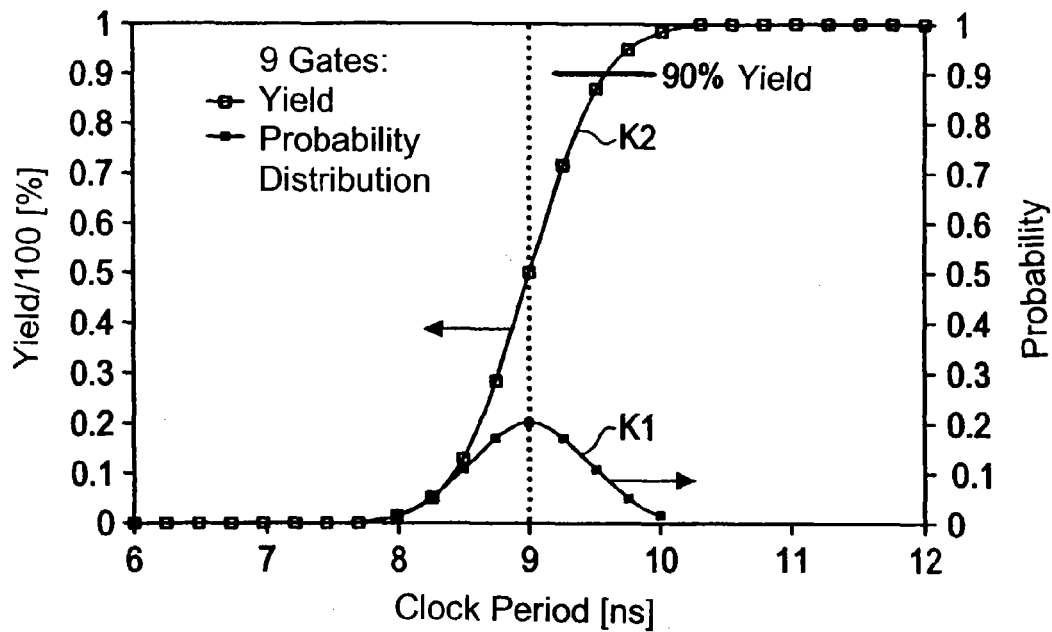
FIG. 3 is a graph illustrating a probability function (yield) and probability distribution of the signal transit times of a path of nine gates.

In FIG. 3, K2 is the yield curve. Both the yield curve K2 and the curve of the probability distribution K1 are plotted against the clock period (i.e., the length of the type B path considered).

A further characteristic of the fluctuation in the turn-on voltage (considered here) is, as already mentioned, the lack of correlation, i.e., directly adjacent transistors can have turn-on voltage differences of up to 6 standard deviations with a probability corresponding to a normal distribution. With a standard deviation of 40 mV of the probability distribution for the turn-on voltage, this corresponds to a difference of 6×40 mV=240 mV between the turn-on voltages of adjacent transistors. The lack in correlation, then, leads to the yield curve of a path depending on the number n of paths of identical configuration (i.e., of the same type).

Figure 4:
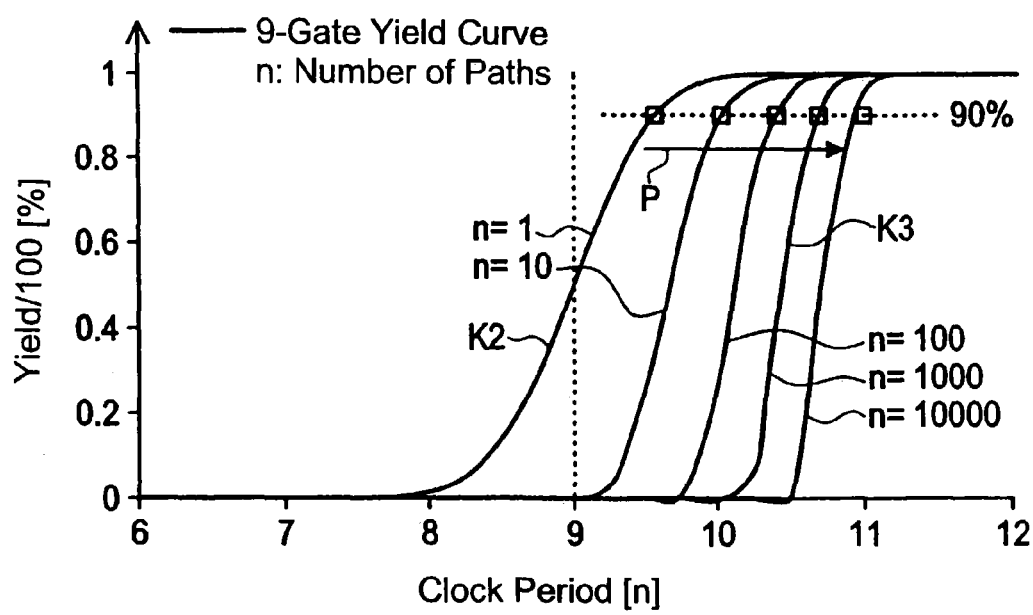
FIG. 4 is a graph illustrating probability functions (yields) of the path transit times of a path group with respect to a different number n of paths contained in the group.

In the text that follows, paths of identical configuration are called path group (a wider definition of this term will be given later). FIG. 4 shows the yield curves of the path group of type B with n=1, 10, 100, 1,000 and 10,000. The curve for n=1 corresponds to yield curve K2, i.e., the yield curve of one path. The yield curves for n>1 are obtained by raising the yield curve K2 to the power of the number n of the paths of the path group. FIG. 4 shows that the clock period (i.e., the length of the path group) increases for a particular yield level, e.g., 90%. The increase is graphically illustrated in FIG. 4 by the arrow P.

Figure 5:
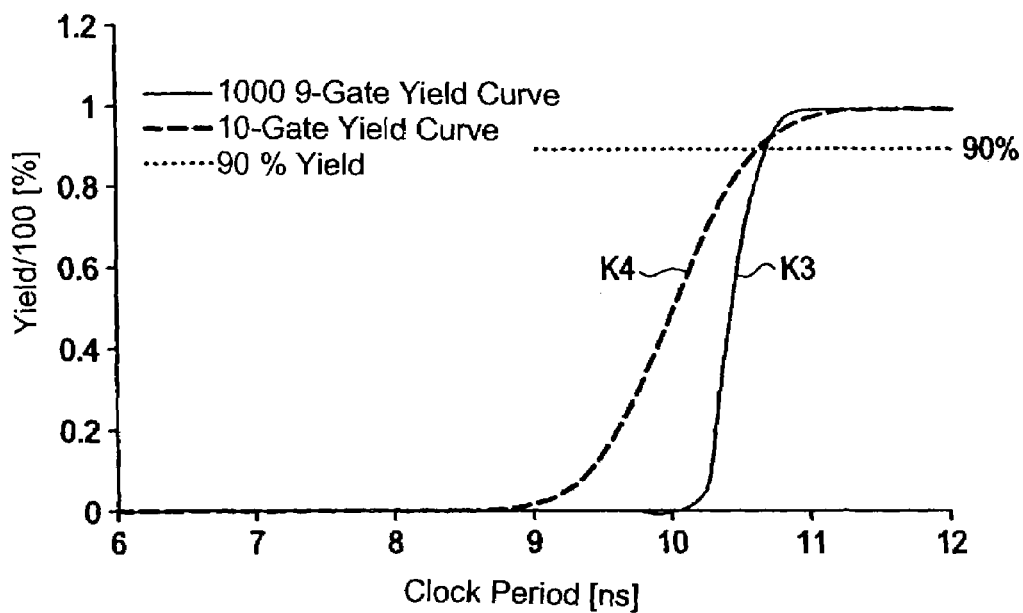
FIG. 5 is a graph illustrating probability functions (yields) of a path of ten gates and of a path group of 1000 paths with nine gates each.

FIG. 5 is used for explaining why, in the circuit example shown in FIG. 1 the conventional determination of the shortest path under said presumptions leads to a wrong result with respect to the determination of the critical path. Curve K3 corresponds to the yield curve, shown in FIG. 4, for n=1000 paths of the path group of the type B paths. In FIG. 5, the yield curve of path P1 (more generally of the path group of the type A paths) is designated by K4. The mean value of the associated probability distribution is located at a clock period of 10 ns because it occurs at a yield of 50%. FIG. 5 illustrates that with a required yield of 90%, the two path groups A and B influence the performance of the circuit with approximately equal weight. If there are more type B paths or the fluctuation of the gate transit times is greater (as already mentioned, a gate transit time fluctuation of 15% was used as a basis for this example), the performance is exclusively determined by the type B paths. In this case, therefore, paths P1', . . . , Pn' and not path P1 must be optimized to improve the performance of the circuit.

In the text that follows, a possible sequence of the method according to the invention will now be explained with reference to the circuit example in FIG. 1.

First, the paths provided in the integrated circuit and their mean path transit times and the standard deviation of the path transit time distribution are determined. As already mentioned, the latter is equal to the root of the sum of the squared gate transit time standard deviations.

Thereafter, those paths that, with certainty, do not limit the processing speed of the integrated circuit can be discarded to reduce the computing effort. This can be done, for example, by no longer taking into consideration in the following process steps all paths, the path transit time of which is shorter than 0.8×Tm, where Tm is the longest mean path transit time found, i.e., 10 ns of path P1 in the example shown in FIG. 1. Because the type B paths do not meet this condition, they are not discarded.

Subsequently, the paths with matching statistical parameters are combined. Combined paths form a path group. The simplest possibility lies in each group exclusively having identical paths. In FIG. 1, a first path group is formed by the type A path P1, and a second path group is created by the type B paths P1', P2', . . . , Pn'. A general definition of a group lies in that the paths contained in the group all have substantially identical mean path transit times and path transit time fluctuations, i.e., are identical or at least similar with respect to their statistical parameters.

Figure 6:
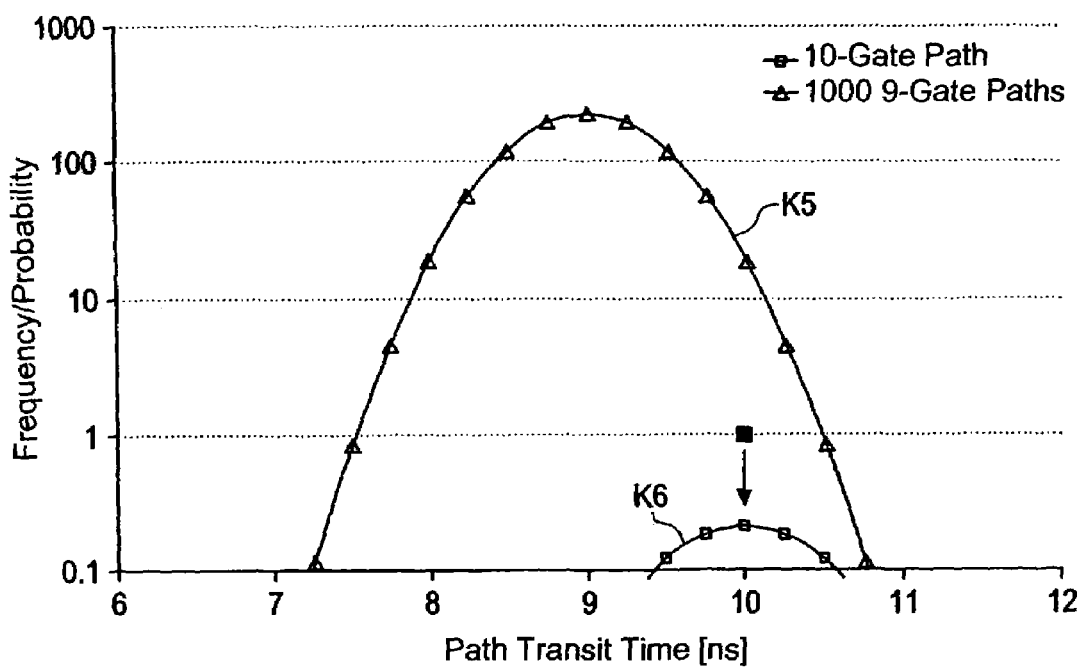
FIG. 6 is a graph illustrating a probability distribution of the path transit times of a path of ten gates and the frequency distribution of a path group of 1000 paths with nine gates each.

In a next step, the mean values and standard deviations of the path transit times of the path group are determined. To reduce the computing effort, the distribution function of the n paths of the group can be represented by the distribution function multiplied by n (probability density) of a path. This step is shown in FIG. 6 for the example explained by FIG. 1. By adding together distribution functions, one changes from the probability density functions to a frequency distribution of path transit times that is plotted along the logarithmically graduated ordinate of the diagram shown in FIG. 6. Curve K5 is obtained by multiplying the probability density function (i.e., the probability distribution) for a type B path by n=1000. This, analogously, produces curve K6 for the group of the type A paths, where n=1 applies in this case because the group only includes one path P1 (to this extent, this remains a probability distribution).

Figure 7:
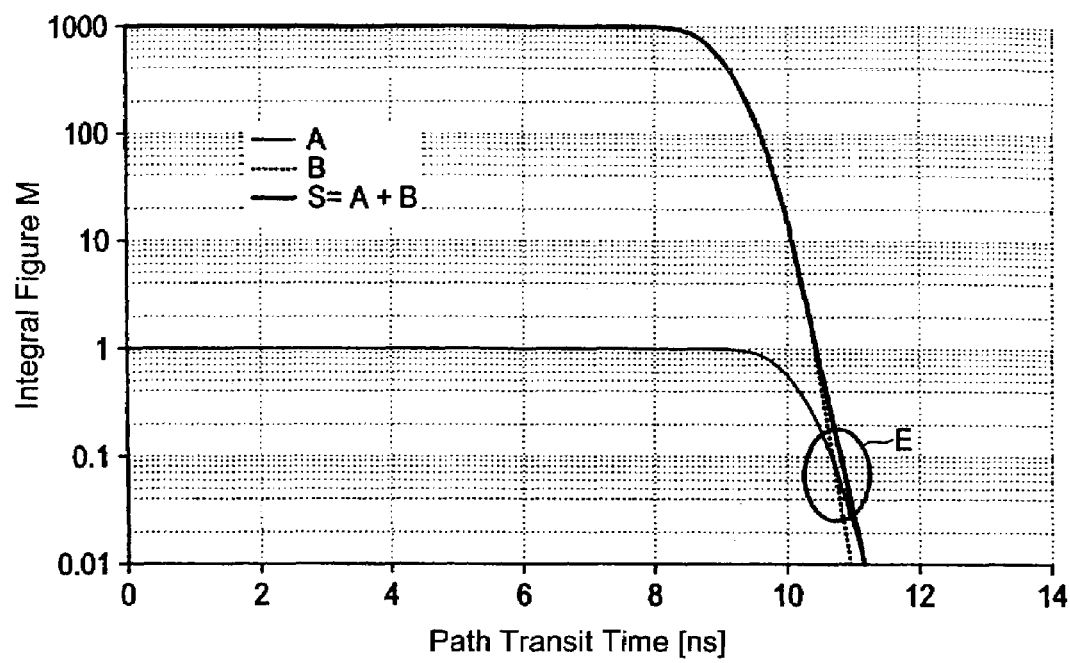
FIG. 7 is a graph illustrating integral figures of the functions shown in FIG. 6 and the sum of these two functions, the direction of integration leading from long path transit times to short path transit times.

After that, in accordance with FIG. 7, the distribution functions added together (i.e., in the general case, the probability distributions allocated to the groups according to K5 and frequency distributions according to K6) are integrated up beginning with a path transit time of infinitely large path transit times toward small path transit times. The integral figure obtained during this process can be represented in the form of:

$$M(T) = \int_{-\infty}^{\infty} F(T')dT' - \int_{-\infty}^{T} F(T')dT'$$

where:
T is the path transit time;
M(T) is the integral figure;
T' is an integration variable; and
F(T') is the added distribution function of a path group.

In FIG. 7, the dotted line B represents the integral figure of the added distribution (curve K5) of the 1000 paths of type B, whereas the continuous thin line A is the distribution (curve K6) of the type A path P1.

In a further step, curve S, shown with a bold continuous line, is, then, calculated that is the sum of the two curves A and B. Curve S represents the integral figure of the totality of all paths considered of the circuit forming the basis of the analysis (the integral figures are plotted logarithmically, which is why the difference between curves S and B is only visible at small values of the integral figure).

Naturally, the step of addition for determining the total integral figure (curve S) can also take place even before the integration by adding the frequency distributions/probability distributions (K5 and K6).

Finally, the critical path or paths of the circuit are determined by comparing the integral figures A and B, taking into consideration the total figure S.

Figure 8:
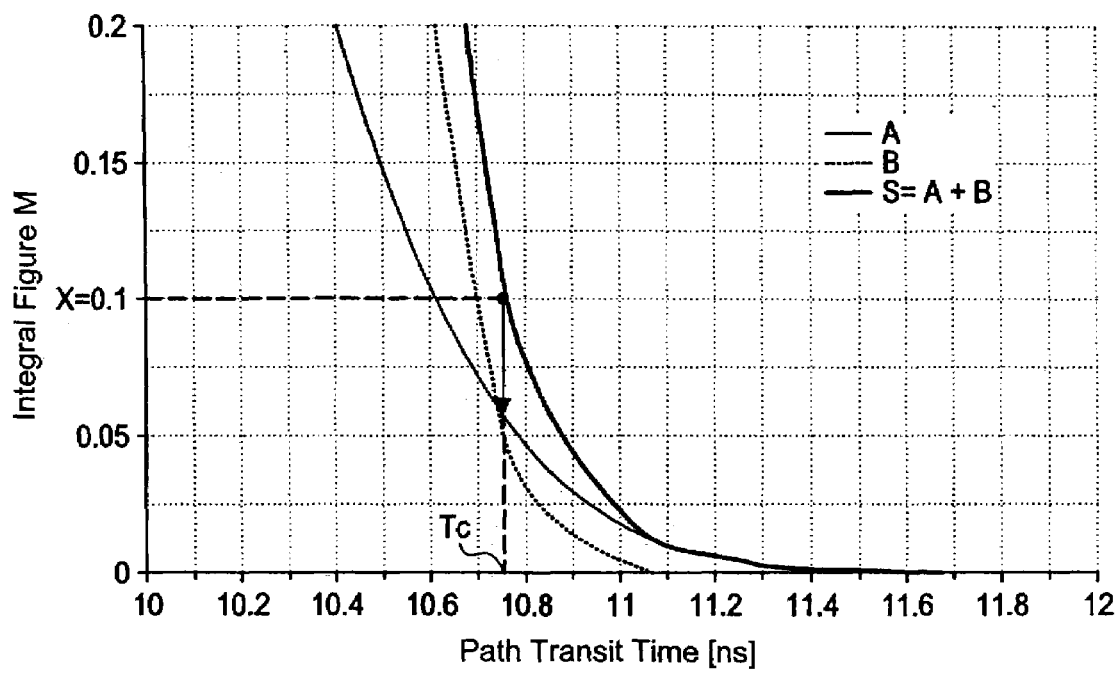
FIG. 8 is a graph illustrating an enlarged section of the diagram of FIG. 7.

FIG. 8 shows the variation of curves A, B, S within the section E shown in FIG. 7 in greater detail. First, a critical clock rate Tc is determined at which the total figure has a value x, x representing a quantity corresponding to the required yield. The relation between the quantity x and a required yield A (in percent) is A=(1−x)·100[%], i.e., x=0.1 at a required yield of 90%.

In FIG. 8, a critical clock rate Tc=10.75 ns is obtained for x=0.1. All paths of path groups that contribute to the total integral figure S in the interval between Tc and T=∞ are, then, determined as critical paths.

FIG. 8 shows that type A paths (curve A) and type B paths (curve B) contribute in approximately equal amounts to the total integral figure S at x=0.1 (the type A path P1 provides a contribution of about 0.055 whereas the contribution of the type B paths is approximately 0.045).

In a concluding step, the paths with a contribution that is comparatively small and is below a predetermined limit value can be eliminated from the set of critical paths found. The limit value depends on the size of the circuit. There is no such path in the example shown in FIG. 8.

The method steps described are performed during a computer-aided analysis or simulation of the circuit on the basis of a circuit design. The circuit design is, then, optimized in dependence on the critical paths found.

We claim:

1. A method for determining at least one critical path of an integrated circuit limiting a processing speed of the integrated circuit, the method which comprises:
   a) determining paths provided in the integrated circuit, mean path transit times of the paths, and path transit time fluctuations of the paths;
   b) ordering the paths to form a path group with the paths having substantially an identical mean path transit time and having an identical path transit time fluctuation;
   c) calculating a group figure for each path group, the group figure statistically describing a path transit time distribution of a respective path group;
   d) calculating a total figure for a totality of the paths considered, the total figure statistically describing the path transit time distribution of the totality of the paths considered; and
   e) determining the at least one critical path of the integrated circuit by comparing group figures at least as great as a critical path transit time determined by taking into consideration the total figure.

2. The method according to claim 1, wherein step (e) further comprises predetermining a value for the total figure and determining the critical path transit time as the path transit time at which the total figure assumes the predetermined value.

3. The method according to claim 2, which further comprises determining as critical paths the paths having group figures exceeding a predeterminable threshold value at least as great as the critical path transit time.

4. The method according to claim 1, which further comprises determining as critical paths the paths having group figures exceeding a predeterminable threshold value at least as great as the critical path transit time.

5. The method according to claim 1, which further comprises, after step a), discarding all the paths having the mean path transit time less than α×Tm, where Tm is a maximum mean path transit time determined in step a) and α is a quantity of less than 1.

6. The method according to claim 1, which further comprises, after step a), discarding all the paths having the mean path transit time less than α×Tm, where Tm is a maximum mean path transit time determined in step a) and α is a quantity equal to approximately 0.8.

7. The method according to claim 1, which further comprises, after step a), discarding all the paths having the mean path transit time less than α×Tm, where Tm is a maximum mean path transit time determined in step a) and α is a quantity of less than approximately 0.8.

8. The method according to claim 1, which further comprises:
   defining the group figure by an integral over a sum of probability distributions of path transit times of the paths of the path group considered; and
   for calculating the sum of the probability distributions, forming a product of a number of paths of the path group and a probability distribution of one path of the path group.

9. The method according to claim 1, which further comprises defining the total figure by a sum of group figures.

10. The method according to claim 1, which further comprises, after step a) and before step b), discarding all the paths having the mean path transit time less than α×Tm, where Tm is a maximum mean path transit time determined in step a) and α is a quantity of less than 1.

11. The method according to claim 1, which further comprises, after step a) and before step b), discarding all the paths having the mean path transit time less than α×Tm, where Tm is a maximum mean path transit time determined in step a) and α is a quantity equal to approximately 0.8.

12. The method according to claim 1, which further comprises, after step a) and before step b), discarding all the paths having the mean path transit time less than α×Tm, where Tm is maximum mean path transit time determined in step a) and α is a quantity of less than approximately 0.8.

13. A method for determining at least one critical path of an integrated circuit limiting a processing speed of the integrated circuit, the method which comprises:
   a) determining paths provided in the integrated circuit, mean path transit times of the paths, and path transit time fluctuations of the paths;
   b) ordering the paths to form a path group with the paths having a substantially identical mean path transit time and a substantially identical path transit time fluctuation;
   c) calculating a group figure for each path group, the group figure statistically describing a path transit time distribution of a respective path group;
   d) calculating a total figure for a totality of the paths considered, the total figure statistically describing the path transit time distribution of the totality of the paths considered; and
   e) determining the at least one critical path of the integrated circuit by comparing the group figures at least as great as a critical path transit time determined by taking into consideration the total figure.

* * * * *